(12) United States Patent
Williams

(10) Patent No.: US 6,731,152 B1
(45) Date of Patent: May 4, 2004

(54) METHOD AND/OR ARCHITECTURE FOR SWITCHING A PRECISION CURRENT

(75) Inventor: Timothy J. Williams, Bellevue, WA (US)

(73) Assignee: Cypress Semiconductor Corp., San Jose, CA (US)

( * ) Notice: Subject to any disclaimer, the term of this patent is extended or adjusted under 35 U.S.C. 154(b) by 60 days.

(21) Appl. No.: 09/997,357

(22) Filed: Nov. 30, 2001

(51) Int. Cl.$^7$ ................................................ H03K 17/00
(52) U.S. Cl. ....................................................... 327/365
(58) Field of Search ................................ 324/765, 754, 324/761, 158.1, 72.5, 758, 73.1; 327/365, 374, 376, 377, 378, 560, 563; 323/313, 314, 907, 315; 307/310, 296.1

(56) References Cited

U.S. PATENT DOCUMENTS 5,160,882 A * 11/1992 Ten Eyck ................... 323/314
5,479,092 A * 12/1995 Pigott et al. ................ 323/313

OTHER PUBLICATIONS

Universal Serial Bus Specification, Revision 2.0, Apr. 27, 2000, pp. 1–622.

* cited by examiner

Primary Examiner—Evan Pert
Assistant Examiner—Jimmy Nguyen
(74) Attorney, Agent, or Firm—Christopher P. Maiorana, P.C.

(57) ABSTRACT

An apparatus comprising a reference circuit, a correction circuit and an output circuit. The reference circuit may be configured to generate a bias signal. The correction circuit may be configured to correct a bias voltage of the bias signal. The output circuit may be configured to generate an output current in response to the bias signal. The bias signal may be corrected in response to the bias voltage.

20 Claims, 5 Drawing Sheets

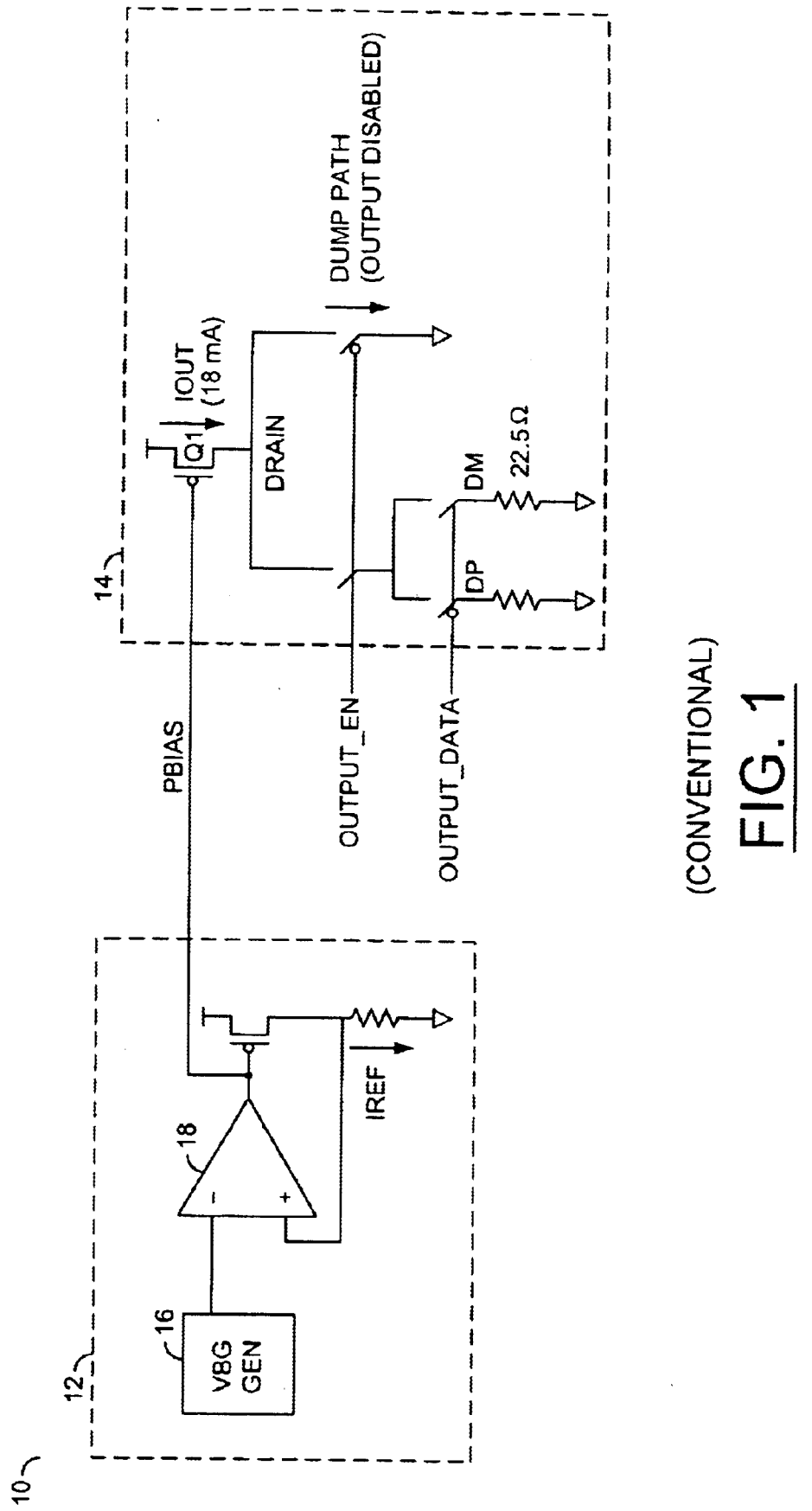
FIG. 1
(CONVENTIONAL)

US 6,731,152 B1

METHOD AND/OR ARCHITECTURE FOR SWITCHING A PRECISION CURRENT

FIELD OF THE INVENTION

The present invention relates to a method and/or architecture for implementing devices for generating precision currents generally and, more particularly, to a method and/or architecture for rapidly switching a precision current on and off.

BACKGROUND OF THE INVENTION

Various systems (i.e., high speed D/A converters) switch large, precise currents to establish signaling. However, such large, precise current driver cells are difficult to quickly power (i.e., turn on and off). The driver cells need delay time for bias voltages and output currents to settle.

Referring to FIG. 1, a typical large, precise current switch 10 is shown. The current switch 10 implements the high speed mode (i.e., 480 Mb/s) described in the Universal Serial Bus (USB) Specification, Version 2.0, published April 2000 and hereby incorporated by reference in its entirety. The USB 2.0 specification defines an output made by switching a nominal current of 18 mA into a 22.5 ohm load to provide 400 mV voltage swings.

The circuit 10 includes a reference circuit 12 configured to establish the bias voltage PBIAS and a current output circuit 14 configured to generate the 18 mA current and differential output signal. The reference circuit 12 includes a voltage bandgap generator 16 and a reference amplifier 18 configured to generate the voltage PBIAS. The voltage PBIAS is applied to a PMOS output transistor Q1 of the output circuit 14 to generate the desired output current IOUT (i.e., the 18 mA current). During transmission, the current IOUT is switched between the differential outputs DP and DM, as selected by the signal OUTPUT_DATA to generate 0 mV and 400 mV voltages. During non-transmission, the output enable signal OUTPUT_EN switches the current IOUT to an internal ground node (i.e., a dump path), where the output is disabled. Therefore, the 18 mA current is not output to the differential signals DP and DM and the lines are at 0 mV.

Once the current IOUT is turned on (i.e., IOUT is switched from 0 mA to 18 mA and flows to either the internal dump path or the outputs), a voltage swing at the node DRAIN couples a disturbance into the node PBIAS. The disturbance on the node PBIAS needs time to settle out. The settling time depends on the size of transistor Q1 and the characteristics of the reference amplifier 18. To avoid the setting time delay, the current IOUT is continuously enabled such that a device can start transmission whenever necessary. The configuration causes increased power dissipation due to the current IOUT being directed to the dump path during non-transmit times.

There are two main power issues relating to the high-speed mode current for USB. First, in USB hubs there are at least 2 and as many as 8 ports that each need a precision 18 mA current during transmission. The power dissipation during non-transmit time is large, since the 18 mA current IOUT is continuously enabled. Secondly, for high-speed (i.e., non-hub) peripherals, there is a competitive advantage to having low enough power consumption to qualify as a USB low power device. USB low power devices are limited to 100 mA current consumption from a USB power source (i.e., from the upstream hub or host). The USB low power rating simplifies powering the downstream devices from a bus-powered (i.e., not self-powered) hub and provides additional flexibility to the USB network.

Settling problems prohibit the circuit 10 from turning on the current IOUT just before transmitting and turning off the current IOUT just after transmitting. For example, USB 2.0 devices have a lead time (i.e., the time before a transmit, once a device recognizes it is to transmit) that is much smaller than the time normally required for the circuit 10 to settle to the desired accuracy. Rapidly turning on the current IOUT in the transistor Q1 (i.e., by closing a switch to the output) causes the bias voltage PBIAS to be disturbed through coupling. The circuit 10 results in an inaccurate current until the bias voltage PBIAS settles at the desired value.

It is generally desirable to provide a device configured to perform rapid switching of a precise current.

SUMMARY OF THE INVENTION

The present invention concerns an apparatus comprising a reference circuit, a correction circuit and an output circuit. The reference circuit may be configured to generate a bias signal. The correction circuit may be configured to correct a bias voltage of the bias signal. The output circuit may be configured to generate an output current in response to the bias signal. The bias signal may be corrected in response to the bias voltage.

The objects, features and advantages of the present invention include providing a method and/or architecture for rapidly switching a precision current on and off that may (i) lower overall power consumption, (ii) be implemented without a wide-bandwidth amplifier to set the bias voltage, (iii) provide a stable amplifier configuration to set references, (iv) isolate the wideband function in a correction amplifier, and/or (v) enable the correction amplifier in a small amount of time.

BRIEF DESCRIPTION OF THE DRAWINGS

These and other objects, features and advantages of the present invention will be apparent from the following detailed description and the appended claims and drawings in which:

FIG. 1 is a block diagram of a conventional output stage current generation device;

DETAILED DESCRIPTION OF THE PREFERRED EMBODIMENTS

Figure 2:
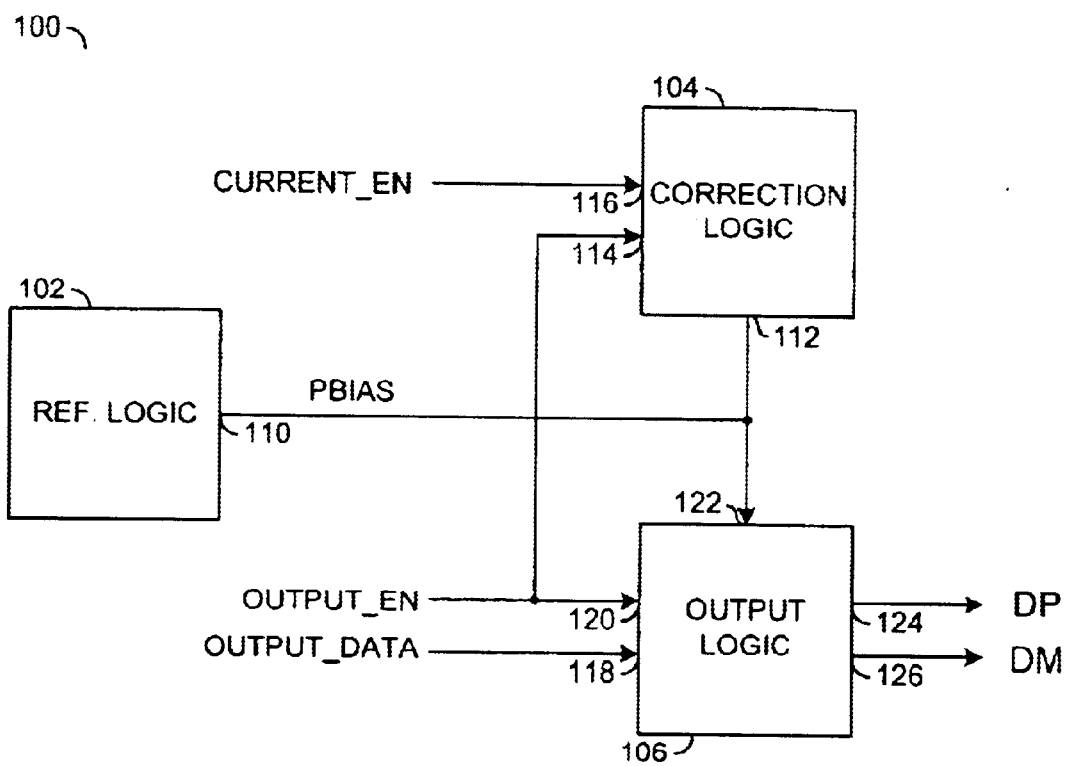
FIG. 2 is a block diagram of a preferred embodiment of the present invention.

Referring to FIG. 2, a block diagram of a circuit (or system) 100 is shown in accordance with a preferred embodiment of the present invention. The circuit 100 may be configured to rapidly switch a precision current on and off. The circuit 100 may be implemented without constantly consuming current while switched between the desired output and an internal unused node (a drawback of of the circuit described in the background section). The circuit 100 may allow for potentially significant power savings.

The circuit 100 generally comprises a reference logic block (or circuit) 102, a correction logic block (or circuit)

104 and an output logic block (or circuit) 106. The reference circuit 102 may have an output 110 that may present a signal (e.g., PBIAS). The signal PBIAS may be a bias voltage. The correction logic 104 may have an input/output 112 that may receive/present the bias voltage PDIAS, an input 114 that may receive a signal (e.g., OUTPUT_EN) and an input 116 that may receive a signal (e.g., CURRENT_EN). The correction circuit 104 may correct a voltage of the signal PBIAS by sourcing/sinking current in response to the signals CURRENT_EN and OUTPUT_EN. The output logic circuit 106 may have an input 118 that may receive a signal (e.g., OUTPUT_DATA), an input 120 that may receive the signal OUTPUT_EN, an input 122 that may receive the signal PBIAS, an output 124 that may present a signal (e.g., DP) and an output 126 that may present a signal (e.g., DM). The signals DP and DM may comprise a differential output signal. The output circuit 100 may generate the differential signal DP and DM in response to the signals OUTPUT_DATA, OUTPUT_EN and PBIAS.

Figure 3:
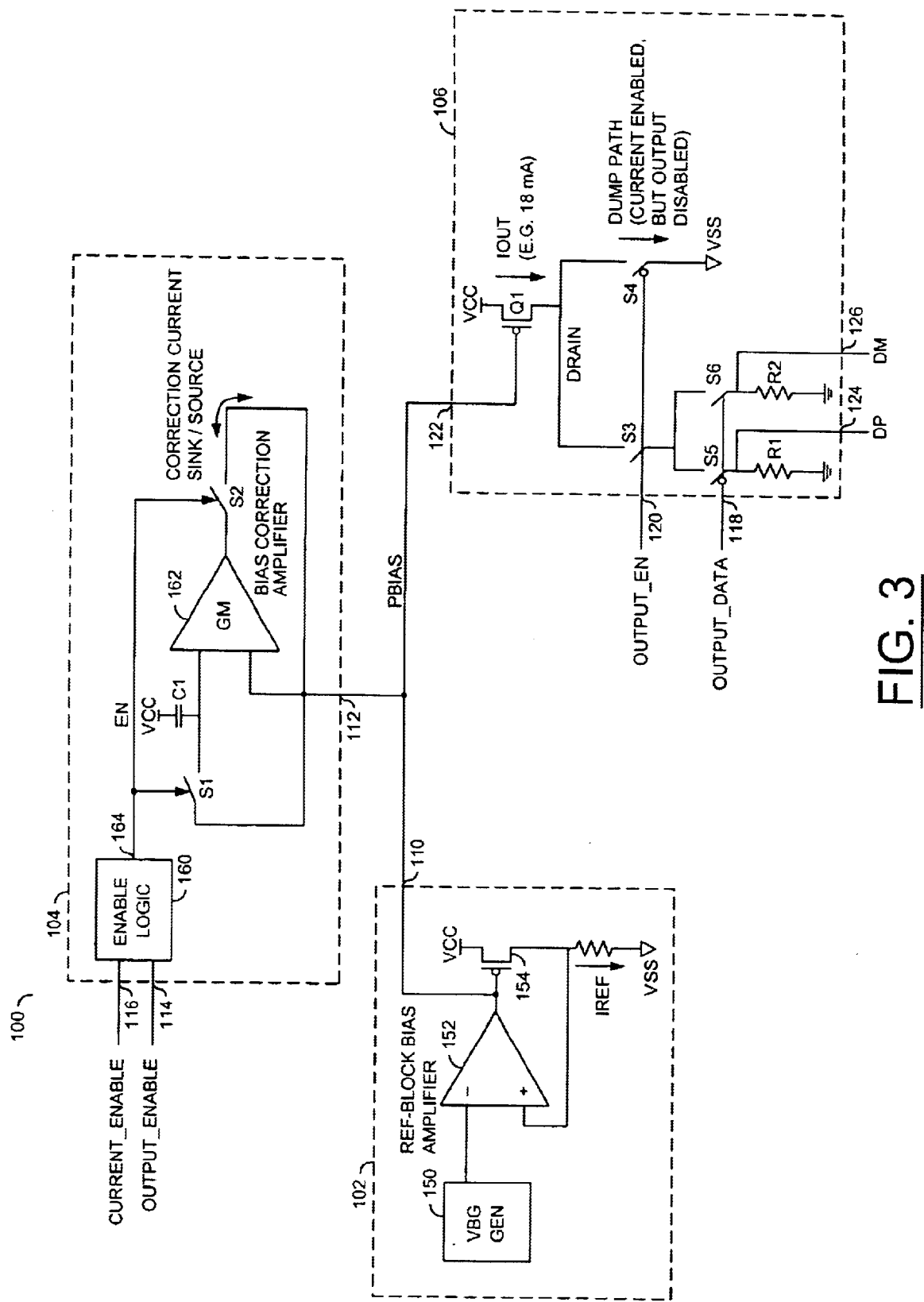
FIG. 3 is a detailed block diagram of the circuit of FIG. 2.

Referring to FIG. 3, a more detailed diagram of the circuit 100 is shown. The reference block 102 generally comprises a voltage bandgap (VBG) generation block (or circuit) 150, an amplifier 152 and a transistor 154. The VBG generator 150 may generate a bandgap voltage (or other appropriate voltage) that may be presented to a first input of the amplifier 152. The amplifier 152 may be implemented as a reference block bias amplifier. A second input of the amplifier 152 may be coupled to ground via a resistor having a predetermined resistance. An output of the amplifier 152 may present the signal PBIAS that may also be coupled to a gate of the transistor 154. The transistor 154 may have a source coupled to a supply voltage (e.g., VCC) and a drain coupled to ground (e.g., VSS) via a resistor having a predetermined resistance.

The correction circuit 104 generally comprises an enable logic block (or circuit) 160, an amplifier 162, a switch (e.g., Si), a switch (e.g., S2) and a capacitor (e.g., C1). In one example, the amplifier 162 may be implemented as a bias correction amplifier. In another example, the amplifier 162 may be implemented as a high bandwidth amplifier. The switches S1–S2 may be implemented as transistors. For example, the switches S1–S2 may be implemented as single PMOS, NMOS, or a combination thereof type device.

The enable block 160 may receive the signal CURRENT_EN and the signal OUTPUT_EN. The enable logic circuit 160 may have an output 164 that may present a signal (e.g., EN). The enable logic circuit 160 may generate the signal EN in response to the signal CURRENT_EN and the signal OUTPUT_EN. The signal EN may be configured to enable the switches S1 and S2. The switch S1 may be coupled between the signal PBIAS and a first input of the amplifier 162. The capacitor C1 may be coupled between the supply voltage VCC and the first input of the amplifier 162. The signal EN may be configured to control the first input to the amplifier 162. The second input to the amplifier 162 may be coupled to the signal PBIAS. The amplifier 162 may be configured to sense and correct changes to the voltage PBIAS. The output of the amplifier 162 may be coupled to signal PBIAS through the switch S2. The switch S2 may control a feedback of the amplifier 162. The amplifier 162, via the switches S1 and S2 may provide current correction (e.g., sinking and sourcing) of the signal PBIAS. The enable circuit 160, the switch S1, the switch S2 and the capacitor C1 may be configured to enable the amplifier 162 to turn on and turn off the current correction of the signal PBIAS in response to the signals PBIAS, CURRENT_EN, and OUTPUT_EN.

The output circuit 106 generally comprises a transistor (e.g., Q1), a switch (e.g., S3), a switch (e.g., S4), a switch (e.g., S5), and a switch (e.g., S6). The switches S3–S6 may be implemented as transistors. For example, the switches S3–S6 may be implemented as single PMOS, NMOS or a combination thereof type devices. The transistor Q1 may have a source coupled to VCC, a gate coupled to the signal PBIAS and a drain coupled to a node (e.g., DRAIN). When the signal PBIAS is low (as determined by particular design criteria), the transistor Q1 may provide a current (e.g., IOUT). The current IOUT may be a precise current such as the 18 mA current required for high speed USB 2.0. The node DRAIN may be coupled to the switch S3 and the switch S4. The switches S3 and S4 may be controlled by the signal OUTPUT_EN. The switches S3 and S4 may have opposite polarities. The switch S3 may be coupled to the switches S5 and S6. The switch S4 may be coupled to the ground VSS. The switch S4 may operate as a dump path, when lot the current IOUT is enabled (via the signal CURRENT_EN) and the output DP and DM is disabled (via the signal OUTPUT_EN). The switches S5 and S6 may be controlled by the signal OUTPUT_DATA. The switch S5 may also be coupled to the output DP. The output DP may be coupled to ground via a resister (e.g., R1). The switch S6 may also be coupled to the output DM. The output DM may be coupled to ground via a resister (e.g., R2). The switches S5 and S6 may have opposite polarities.

Figure 4:
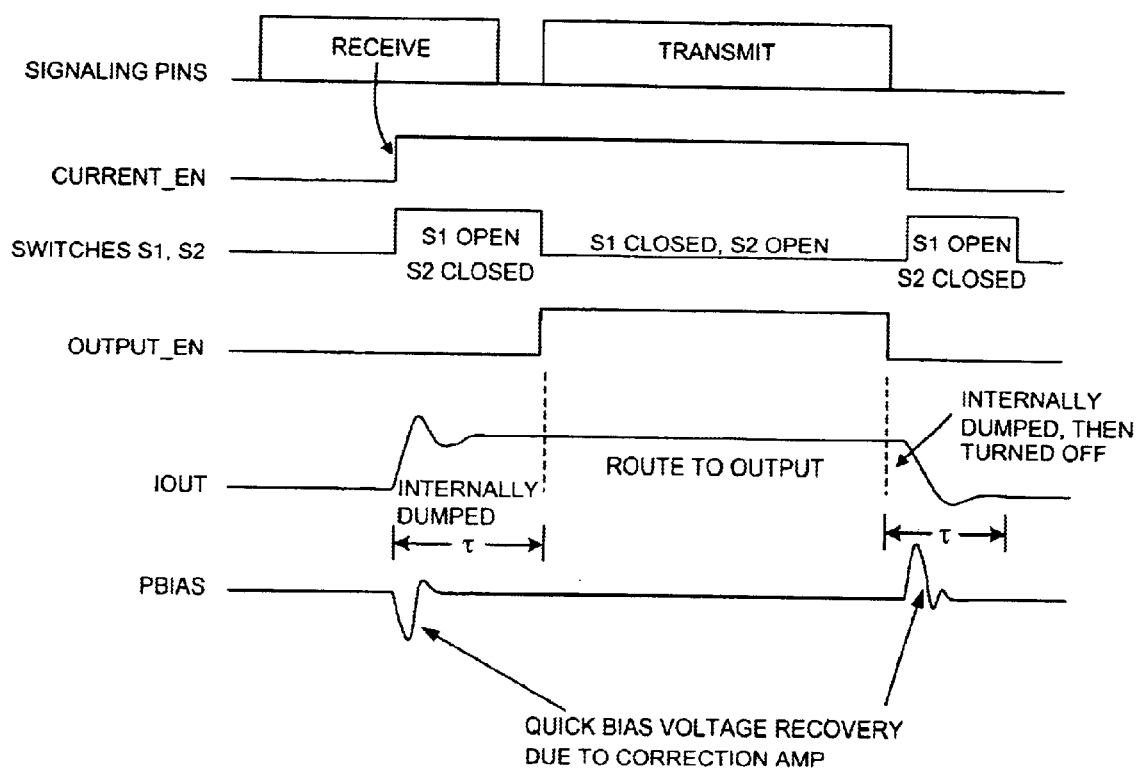
FIG. 4 is a timing diagram illustrating an operation of the present invention.

Referring to FIG. 4, a timing diagram 180 illustrating an operation of the circuit 100 is shown. The timing diagram may illustrate operation of the circuit 100 in response to traffic on signal pins (e.g., RECEIVE and TRANSMIT). During idle times the voltage PBIAS may be continuously driven to the sampling capacitor C1 (e.g., the switch S1 is closed). In response to an event requiring transmit (e.g., the event RECEIVE), the switch S1 may be opened to save the stable state of the voltage PBIAS on the capacitor C1. The output current IOUT may then be enabled and routed to the internal dump path. Since turning on the current IOUT may cause disturbance of the bias line PBIAS, the switch S2 may be closed as the switch S1 is opened to allow the bias correction amplifier 162 to source or sink current into the bias line PBIAS as sensed (e.g., change in the voltage PBIAS). The amplifier 162 may be configured to provide quick correction of the voltage PBIAS once the current IOUT is turned on. Such a configuration may restore the voltage PBIAS to the original value held by the capacitor C1. After sufficient time (e.g., a time $\tau$) for the current IOUT to settle to a predetermined accuracy, the current IOUT is ready to be switched to the output (via the signal OUTPUT_EN). Once the event TRANSMIT starts, the switch S2 may be opened to disable the function of the amplifier 162 and the switch S1 may be closed to resample the voltage PBIAS.

When the current IOUT is turned off, a similar sequence may occur. The switch S1 may be opened, the switch S2 may be closed and the current IOUT may be disabled. However, the output circuit 106 may cause a disturbance of the bias voltage PBIAS (in the opposite direction). The disturbance may also be sensed by the correction amplifier 162 and corrected via sourcing/sinking of current to bring the bias voltage PBIAS back to the original value (stored by the capacitor C1). The quick-recovery turn off process of the circuit 100 may be applicable to high speed systems that quickly transmit data packets.

USB protocols allow for a transmit lead time of 20–50 ns for high speed mode. However, the response time of the circuit 10 is on the order of 1 microsecond. The circuit 100 may be able to restore the output current IOUT to an error of less than 2% within 20 ns. Therefore, the circuit 100 may be configured to provide proper USB signaling levels.

Alternatively, the control signals CURRENT_EN and OUTPUT_EN may be varied to meet the design criteria of a particular implementation. Furthermore, the sampling scheme of the circuit 100 may be varied by removing the switch S1 and using a simple RC configuration to average the value of the line PBIAS. Additionally, the output of the amplifier 162 may not need to be disabled (e.g., the switch S2 is always closed).

Figure 5:
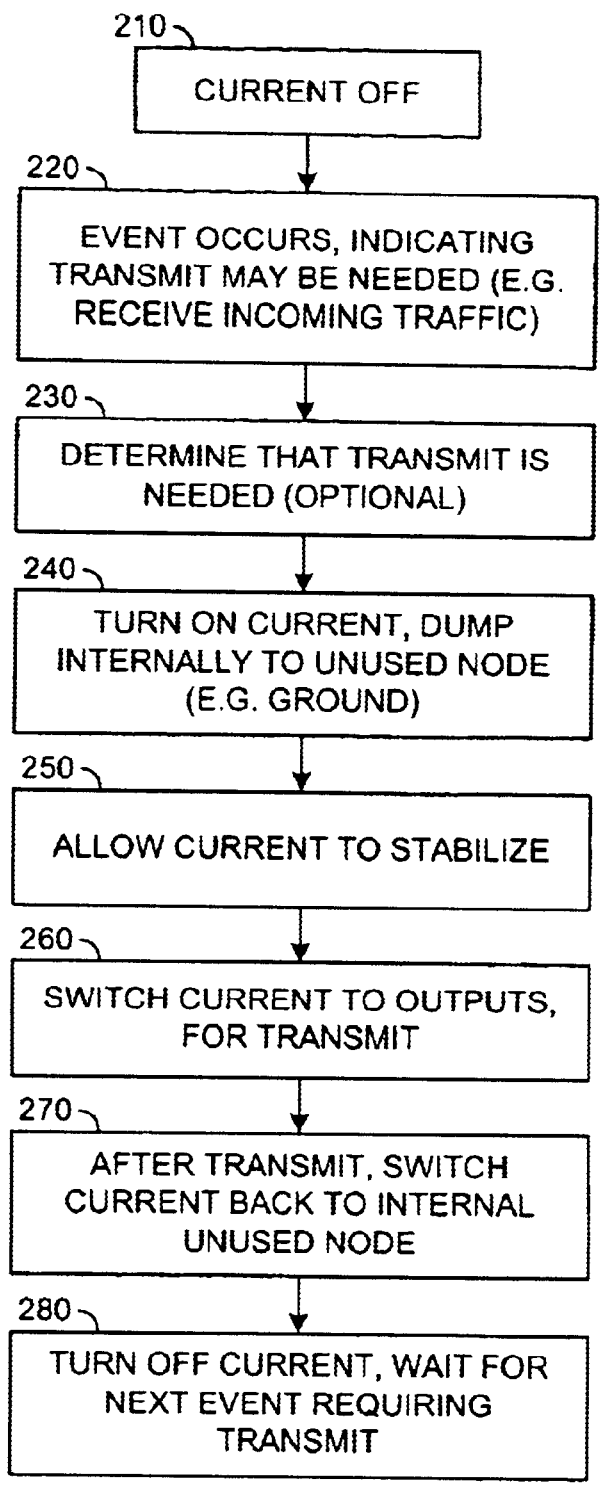
FIG. 5 is a flow chart illustrating an operation of the present invention.

Referring to FIG. 5, a flow chart of a method (or process) 200 illustrating an operation of the circuit 100 is shown. The process 200 may comprises a state 210, a state 220, a state 230, a state 240, a state 250, a state 260, a state 270, and a state 280. While in the state 210, the process 200 may turn the current IOUT off, via the control signal CURRENT_EN. While in the state 220, the process 200 may detect an event. For example, the process 200 may receive incoming traffic (e.g., the signal RECEIVE), indicating a transmit may be needed. While in the state 230, the process 200 may determine if a transmit is needed. Optionally, the state 230 may be omitted. Once a transmit event is to occur at the state 220 (or 230), a short settling (or delay) time (e.g., the time τ) is needed by the circuit 100. While in the state 240, the process 200 may turn on the current IOUT and dump the current IOUT to the ground VSS. While in the state 250, the process 200 may allow the current IOUT to stabilize. While in the state 260, the process 200 may switch the current IOUT to the outputs DP and DM for transmit. The state 250 may provide sufficient time for the circuit 100 to accurately settle before the current IOUT is used to generate output signals DP and DM at the state 260. While in the state 270, the process 200 may switch the current IOUT back to the internal dump mode after transmit. While in the state 280, the process 200 may turn off the current IOUT (via the signal CURRENT_EN) and wait for a next event.

The circuit 100 may be implemented without needing a wide-bandwidth amplifier to set the reference bias PBIAS. The circuit 100 may provide a stable reference amplifier configuration that may not limit bandwidth. The circuit 100 may allow the wideband function to be isolated in the correction amplifier 162 that may be enabled a small amount of time. The circuit 100 may provide a two amplifier (e.g., the amplifier 152 and the amplifier 162) architecture that may rapidly correct the bias voltage PBIAS. The circuit 100 may provide a two amplifier architecture that may isolate wide-bandwidth element to the correction amplifier 162.

The circuit 100 may provide a dual-amplifier architecture that may provide fast and accurate switching of a current (e.g., 2% accuracy in 20 ns from 0 to 18 mA). The correction amplifier 162 may be configured to rapidly correct the bias voltage PBIAS via sourcing/sinking of current. The circuit 100 may only allow current dumping to occur briefly before and after transmit. The circuit 100 may allow the correction amplifier 162 to sense change on the bias voltage PBIAS and sink/source current to correct the bias voltage PBIAS. The amplifier 162 may be enabled in response to the signals CURRENT_EN and OUTPUT_EN.

The circuit 100 may be configured to rapidly settle a current. The circuit 100 may set the voltage PBIAS with the amplifier 152. The circuit 100 may sample the voltage PBIAS and enable a correction current based on the voltage PBIAS. The circuit 100 may sense changes in the voltage PBIAS with the correcting amplifier 162. The amplifier 162 may be configured to correct the voltage PBIAS. The circuit 100 may also disable the amplifier 162 after the voltage PBIAS is corrected.

The circuit 100 may allow large current to be turned off during all non-transmit times. The circuit 100 may quickly generate high precision currents. For example, the circuit 100 may generate precise currents with 2% accuracy (6 to 7-bit) within 20 ns. The circuit 100 may be configured to rapidly switch current from 0 to a precise 18 mA value. The circuit 100 may have low overall power consumption, due to the ability to turn off the large output current IOUT during non-transmit times. The circuit 100 may be applicable to enable low-power high speed USB devices. Although the present invention has been described in connection with high speed USB 2.0 operation, it is applicable to other systems, particularly communication systems where currents are switched.

The particular polarities of the on (e.g., asserted) and off (e.g., de-asserted) states of the various switches of the present invention may be adjusted (e.g., reversed) accordingly to meet the design criteria of a particular implementation. Furthermore, a particular technology of the switches may be varied (e.g., bipolar, MOS, etc.).

While the invention has been particularly shown and described with reference to the preferred embodiments thereof, it will be understood by those skilled in the art that various changes in form and details may be made without departing from the spirit and scope of the invention.

I claim:

1. An apparatus comprising:
    a reference circuit comprising a reference amplifier configured to generate a bias signal;
    a correction circuit comprising a bias correction amplifier configured to correct a bias voltage of said bias signal; and
    an output circuit configured to generate an output current in response to said bias signal, wherein said bias signal is corrected in response to said bias voltage.

2. The apparatus according to claim 1, wherein said correction circuit is configured to rapidly sink and source current to correct said bias signal.

3. The apparatus according to claim 1, wherein said correction circuit is configured in response to a current enable signal.

4. The apparatus according to claim 3, wherein said correction circuit is further configured in response to an output enable signal.

5. The apparatus according to claim 4, wherein said output circuit is further configured in response to an output data signal.

6. The apparatus according to claim 1, wherein said correction circuit is further configured to sense changes to said bias voltage.

7. The apparatus according to claim 1, wherein said correction circuit comprises:
    an amplifier configured to correct said bias signal; and
    an enable circuit configured to enable said amplifier.

8. The apparatus according to claim 1, wherein said correction circuit is further configured to provide wide-bandwidth.

9. The apparatus according to claim 1, wherein said output circuit is further configured to generate a differential signal in response to said output current.

10. A method for rapid switching of a precise current, comprising the steps of:
    (A) setting a bias voltage with a first amplifier;
    (B) providing said precise current in response to said bias voltage;
    (C) correcting said bias voltage with a correction current from a second amplifier; and
    (D) generating a differential output signal in response to said precise current.

11. The method according to claim 10, wherein step (C) further comprises:

sampling said bias voltage.

12. The method according to claim 11, wherein step (C) further comprises:

enabling said second amplifier based on said bias voltage.

13. The method according to claim 10, wherein step (C) further comprises:

sensing changes in said bias voltage.

14. The method according to claim 10, wherein step (C) further comprises:

disabling said second amplifier after said bias voltage is corrected.

15. The method according to claim 10, wherein step (C) further comprises:

isolating wideband bandwidth to said second amplifier.

16. The method according to claim 10, wherein step (D) further comprises:

turning on and off said precise current in response to one or more control signals.

17. The method according to claim 10, wherein step (D) further comprises:

reducing overall power consumption.

18. The method according to claim 10, wherein step (D) further comprises:

turning on and off said precise current during non-transmit times.

19. An apparatus for rapid switching of a precise current, comprising:

means for setting a bias voltage with a first amplifier;

means for providing said precise current in response to said bias voltage;

means for correcting said bias voltage with a correction current from a second amplifier; and means for generating a differential output signal in response to said precise current.

20. An apparatus comprising:

a reference circuit configured to generate a bias signal;

a correction circuit comprising (i) an amplifier configured to correct a bias voltage of said bias signal and (ii) an enable circuit configured to enable said amplifier; and an output circuit configured to generate an output current in response to said bias signal, wherein said bias signal is corrected in response to said bias voltage.

* * * * *